US012658868B2

(12) United States Patent
Kanagal Ramesh et al.

(10) Patent No.: US 12,658,868 B2
(45) Date of Patent: Jun. 16, 2026

(54) DIFFERENTIAL AMPLIFIER ARRANGEMENT AND CONVERTER ARRANGEMENT

(71) Applicant: ams International AG, Jona (CH)

(72) Inventors: Srinidhi Koushik Kanagal Ramesh, Pfäffikon (CH); Markus Auer, Thalwil (CH)

(73) Assignee: AMS INTERNATIONAL AG, Jona (CH)

( * ) Notice: Subject to any disclaimer, the term of this patent is extended or adjusted under 35 U.S.C. 154(b) by 450 days.

(21) Appl. No.: 18/257,119

(22) PCT Filed: Nov. 16, 2021

(86) PCT No.: PCT/EP2021/081841
§ 371 (c)(1),
(2) Date: Jun. 13, 2023

(87) PCT Pub. No.: WO2022/128289
PCT Pub. Date: Jun. 23, 2022

(65) Prior Publication Data
US 2024/0106400 A1    Mar. 28, 2024

(30) Foreign Application Priority Data

Dec. 17, 2020    (DE) .................... 10 2020 133 990.9

(51) Int. Cl.
H03F 3/45        (2006.01)
H03F 1/26        (2006.01)
H03G 3/30        (2006.01)

(52) U.S. Cl.
CPC ........... H03F 3/45475 (2013.01); H03F 1/26 (2013.01); H03F 3/45941 (2013.01);
(Continued)

(58) Field of Classification Search
CPC .. H03F 3/45475; H03F 1/26; H03F 2200/129; H03F 3/45937; H03F 3/45941;
(Continued)

(56) References Cited

U.S. PATENT DOCUMENTS 3,582,802 A    6/1971  Weekes et al.
6,998,917 B2    2/2006  Kudo et al.
(Continued)

FOREIGN PATENT DOCUMENTS

EP        1947544 A1    7/2008
EP        3413462 A1 * 12/2018   ......... H03F 3/45659
(Continued)

OTHER PUBLICATIONS

Mouanda, T. (Authorized Officer), International Search Report and Written Opinion dated Feb. 24, 2022, PCT Application No. PCT/EP2021/081841, 12 pages.
(Continued)

*Primary Examiner* — Andrea Lindgren Baltzell
*Assistant Examiner* — Lance Torbjorn Bartol
(74) *Attorney, Agent, or Firm* — MH2 Technology Law Group LLP

(57) ABSTRACT

In one embodiment a differential amplifier arrangement includes a first input configured to receive a first input signal, a second input configured to receive a second input signal, a first output configured to provide a first output signal, a second output configured to provide a second output signal, a common mode loop configured to regulate a common mode output of the differential amplifier arrangement depending on a difference between a common mode reference signal and an average of the first and the second output signal, and a differential mode loop configured to regulate a differential mode output of the differential amplifier arrangement depending on a difference between a dif-
(Continued)

ference between the first and the second input signal and a difference between the first and the second output signal. Therein the difference between the first and the second output signal is substantially constant.

8 Claims, 3 Drawing Sheets

(52) U.S. Cl.
CPC ..... *H03G 3/3036* (2013.01); *H03F 2200/129* (2013.01); *H03F 2200/135* (2013.01); *H03F 2200/408* (2013.01); *H03F 2200/411* (2013.01); *H03F 2203/45008* (2013.01); *H03F 2203/45116* (2013.01); *H03F 2203/45418* (2013.01); *H03F 2203/45424* (2013.01); *H03F 2203/45512* (2013.01); *H03F 2203/45526* (2013.01)

(58) Field of Classification Search
CPC ......... H03F 2200/135; H03F 2200/408; H03F 2200/411; H03F 2203/45008; H03F 2203/45418; H03F 2203/45116; H03F 2203/45424; H03F 2203/45512; H03F 2203/45526; H03G 3/3036
USPC ................................................ 330/254, 258
See application file for complete search history.

(56) References Cited

U.S. PATENT DOCUMENTS

| | | | |
|---|---|---|---|
| 7,884,672 B1 | 2/2011 | Cetin et al. | |
| 8,222,877 B2 | 7/2012 | Cerchi et al. | |
| 10,474,173 B2 * | 11/2019 | Nakashima | ............. G05F 1/467 |

| | | | |
|---|---|---|---|
| 2007/0030069 A1 | 2/2007 | Huang | |
| 2008/0048778 A1 | 2/2008 | Lee et al. | |
| 2008/0278234 A1 * | 11/2008 | Haila | .................... H03F 3/3001 |
| | | | 330/264 |
| 2008/0284513 A1 * | 11/2008 | Chang | ................. H03F 3/45659 |
| | | | 330/258 |
| 2009/0251216 A1 | 10/2009 | Giotta et al. | |
| 2014/0132341 A1 | 5/2014 | Wang et al. | |
| 2015/0035598 A1 * | 2/2015 | Huang | ................ H03F 3/45636 |
| | | | 330/260 |
| 2017/0170795 A1 * | 6/2017 | Garbarino | ........... H03F 3/45179 |
| 2018/0069513 A1 * | 3/2018 | Kumar | ................ H03F 3/45941 |
| 2020/0304034 A1 * | 9/2020 | Namekawa | ........... H02M 3/156 |

FOREIGN PATENT DOCUMENTS

| | | | | |
|---|---|---|---|---|
| EP | 3439175 A1 | | 2/2019 | |
| JP | 2002358582 A | * | 12/2002 | |
| JP | 2004274434 A | * | 9/2004 | |
| TW | 201307875 A | * | 2/2013 | ............. G01R 31/52 |

OTHER PUBLICATIONS

Green, T. "Operational Amplifier Stability Part 8 of 15: Cap Load Stability: Noise Gain & CF" Linear Applications Engineering Manager, Burr-Brown Products from Texas Instruments https://e2e.ti.com/cfsfile/_key/Communityserverdiscussions-componentsfiles/14/Stability-for-Op-Amps-Part-8.pdf.

Hester, R. et al., "A Monolithic Data Acquisition Channel" IEEE Journal of Solidstate Circuits, IEEE,USA, vol. 18, No. 1, Feb. 1, 1983, pp. 57-65, XP011422249.

Sneep, J., et al., "Design of a low-noise 100-MHz balanced Schmitt-trigger oscillator" Solid-State Circuits Conference, 1989. ESSCIRC '89. Proceedings of the 15th European, IEEE, Piscataway, NJ, USA,—Sep. 20, 1989, pp. 284-287, XP031677946.

* cited by examiner

DIFFERENTIAL AMPLIFIER ARRANGEMENT AND CONVERTER ARRANGEMENT

CROSS-REFERENCE TO RELATED APPLICATIONS

The present application is the national stage entry of International Patent Application No. PCT/EP2021/081841, filed on Nov. 16, 2021, and published as WO 2022/128289 A1 on Jun. 23, 2022, which claims priority to German Application No. 10 2020 133 990.9, filed on Dec. 17, 2020, the disclosures of all of which are incorporated by reference herein in their entireties.

FIELD OF THE INVENTION

This disclosure relates to the field of amplifier design. Specifically, the application is directed to a differential amplifier arrangement and a converter arrangement.

BACKGROUND OF THE INVENTION

The design of a fully differential amplifier for driving high capacitive loads in micro Farad range, to serve as reference for data converters e.g. an analog-to-digital converter, ADC, shall fulfill different requirements, for example, low output impedance & good settling time to meet linearity requirements, as well as, good noise performance.

To meet these requirements a first known solution slows the amplifier down and uses an isolation resistor for decoupling the external capacitor from the amplifier. The drawback of this solution is that said isolation resistor limits the load regulation.

A second known solution employs a dual feedback technique using a slow feedback path including the isolation resistor in the loop and a high frequency loop by connecting the output to the input excluding the isolation resistor. Said solution suffers from the drawback that the internal loop needs to be much slower than if the amplifier were simply externally compensated. Said drawbacks also apply to the first solution.

Moreover, both above described solutions are applicable only to driving capacitors connected to ground. When driving both terminals of a capacitor, in both the solutions mentioned above, the frequency band in which the loop gain crosses zero decibel is large, which implies a much worse noise bandwidth and/or gain peaking.

It is therefore an objective to provide a differential amplifier arrangement and a converter arrangement which resolve at least some of the shortcomings of the prior art described above.

The objective is achieved by the subject matter of the independent claims. Further developments and embodiments are defined in dependent claims.

The definition of terms provided in the above also applies to the following description unless stated otherwise.

SUMMARY OF THE INVENTION

In one embodiment a differential amplifier arrangement comprises a first input, a second input, a first output, a second output, a common mode loop and a differential mode loop. The first input is configured to receive a first signal. The second input is configured to receive a second input signal. The first output is configured to provide a first output signal. The second output is configured to provide a second output signal. The common mode loop is configured to regulate a common mode output of the differential amplifier arrangement depending on a difference between a common mode reference signal and an average of the first and the second output signal. The differential mode loop is configured to regulate a differential mode output of the differential amplifier arrangement depending on a difference between a difference between the first and the second input signal and a difference between the first and the second output signal. Therein, the difference between the first and the second output signal is substantially constant.

By means of the common mode loop of the differential amplifier arrangement the common mode output is regulated as a function of the difference between the common mode reference signal, and the average of the first and the second output signal, i.e. half of a sum of the first and the second output signals. The differential mode loop regulates the differential mode output of the differential amplifier arrangement. For this, the difference between the first and the second input signal, as well as the difference between the first and the second output signal is used to form a difference between said differences which is used for regulating the differential mode output. The difference between the first and the second output signal is kept substantially constant.

In a development, the common mode loop is further configured to implement at least one low frequency pole by means of which the common mode loop is slowed down.

The differential amplifier arrangement as proposed realizes a compensation scheme for the common mode loop without affecting the various parameters of the differential mode loop. This improves stability of the differential amplifier arrangement. Furthermore, a high direct current, DC, accuracy is achieved.

In a development, a unity gain frequency of the common mode loop is higher than a unity gain frequency of the differential mode loop.

In a development, an overall common mode loop of the amplifier arrangement is further configured to implement at least two poles and zeros by means of which a gain of the overall common mode loop has a 20 decibel per decade zero crossing.

By doing so, the overall common mode loop is stabilized despite the lack of an external pole for the same. Since the constraints on the common mode loop are also more relaxed, use of poles and zeros for its stability is not much of a concern from transient response.

In a development, the differential amplifier arrangement comprises at least a first and a second amplifying stage. The first amplifying stage comprises a first differential amplifier having a first pair of differential input terminals, a first pair of differential output terminals and a control terminal. The first pair of differential input terminals is connected to the first and the second input of the differential amplifier arrangement. The second amplifying stage comprises a second differential amplifier having a second pair of differential input terminals and a second pair of differential output terminals. The second pair of differential output terminals is connected to the first pair of differential output terminals of the first amplifier. The second pair of differential output terminals is connected to the first and the second output of the differential amplifier arrangement.

In an optional development the differential amplifier arrangement may also comprise a third amplifying stage, which is coupled downstream of the second amplifying stage, i.e. between the second differential output pair and the first and the second output.

In another optional development the differential amplifier arrangement may have even more than three stages.

In a development the common mode loop comprises at least the first and the second amplifying stage, a common mode feedback amplifier and a filter component. The common mode feedback amplifier has a first and a second feedback input terminal and a feedback output terminal. The first feedback input terminal is configured to receive the average of the first and the second input signals. The feedback output terminal is connected to a control terminal of the first differential amplifier. The filter component comprises a filter capacitor and a filter resistor. The filter capacitor is connected to the second feedback input terminal and to a reference potential terminal. The filter resistor is connected with one terminal to the second feedback input terminal. Another terminal of the filter resistor is configured to receive the average of the first and the second output signals.

The common mode feedback amplifier regulates a part of a current source of the first amplifier via its control terminal depending on the difference between the average of the first and the second input signals and the average of the first and the second output signals. The filter component realizes a low frequency pole which improves the stability of the common mode loop. This dedicated low frequency pole is deliberately introduced into the common mode loop, which otherwise would rely just on internal parasitic capacitances.

In a development the differential mode loop comprises the first and the second amplifying stage, as well as a first and a second transimpedance element. The first transimpedance element is connected in a feedback loop between a first terminal of the second pair of differential input terminals and a first terminal of the second pair of differential output terminals of the second differential amplifier, thereby forming a first branch of the differential mode loop. The second transimpedance element is connected in a feedback loop between a second terminal of the second pair of differential input terminals and a second terminal of the second pair of differential output terminals of the second differential amplifier, thereby forming a second branch of the differential mode loop.

By means of the first and the second transimpedance elements a lag lead compensation is realized which stabilizes the first and the second branch of the differential mode loop. Trading of the DC gain against the settling time as in state of the art solutions is consequently avoided. In addition usage of the transimpedance elements helps achieve constant load regulation across process, voltage and temperature.

In a further development each of the first and the second transimpedance elements comprises a first and a second resistor, and a first and a second capacitor. Therein the first resistor and the first capacitor are connected in parallel forming a parallel connection. The second resistor is connected in series to the parallel connection, thereby forming a serial connection. The second capacitor is connected in parallel to the serial connection.

In a refinement, a capacitance of the first capacitor is dimensioned to be larger, for example, ten times larger than a capacitance of the second capacitor.

In a refinement, respective resistances of the first and the second resistor are dimensioned substantially equal.

Each transimpedance element realizes a pole which gives rise to a 20 decibel per decade zero crossing of the loop gain of the common mode loop. The first and the second resistor set the gain value of the differential amplifier arrangement. Together with the first capacitor, first and second resistors create a pole and a zero for stabilization of the differential loop. The second capacitor adds a pole which mainly serves for further stabilizing the common mode loop.

In a development the common mode reference signal is represented by an average of the first and the second input signal.

In an alternative implementation the common mode reference signal may be generated externally.

In a development the first output of the differential amplifier arrangement is configured to be connected to a first terminal of a connectable load capacitor. The second output of the differential amplifier arrangement is configured to be connected to a second terminal of the connectable load capacitor.

The proposed amplifier arrangement thereby forms an externally compensated, i.e. by the connectable load capacitor, multi-stage fully differential amplifier. The load capacitor may have considerable load, for instance in the range of several micro Farad. By means of the design of the amplifier arrangement as described above, driving of the high capacitance load, as represented by the load capacitor, is enabled.

In one embodiment a converter arrangement comprises the differential amplifier arrangement as described directly above, the load capacitor which is connected between the first and the second output of the differential amplifier arrangement, and an analog-to-digital converter. Said analog-to-digital converter is connected between the first and the second output of the differential amplifier arrangement.

The converter arrangement, which is based on the differential amplifier arrangement as defined above, achieves a good linearity and low output impedance, for instance below one Ohm. Furthermore, the settling time and the noise performance are improved in comparison to state of the art solutions described in the beginning. Also, just one capacitor which is external to the differential amplifier arrangement, is required to operate the converter arrangement. This external capacitor is represented by the load capacitor. Said load capacitor is connected differentially. Compared with state of the art solutions described in the beginning, a second normally required external capacitor can be saved.

This allows for design of an amplifier that is truly limited by a differential loop time constant, formed together with the external capacitor and thereby, by linearity constraints, rather than by common-mode loop which has much more relaxed constraints.

BRIEF DESCRIPTION OF THE DRAWINGS

The text below explains the proposed differential amplifier arrangement and converter arrangement in detail using exemplary embodiments with reference to the drawings. Components and circuit elements that are functionally identical or have the identical effect bear identical reference numbers. In so far as circuit parts or components correspond to one another in function, a description of them will not be repeated in each of the following figures. Therein.

DETAILED DESCRIPTION

Figure 1:
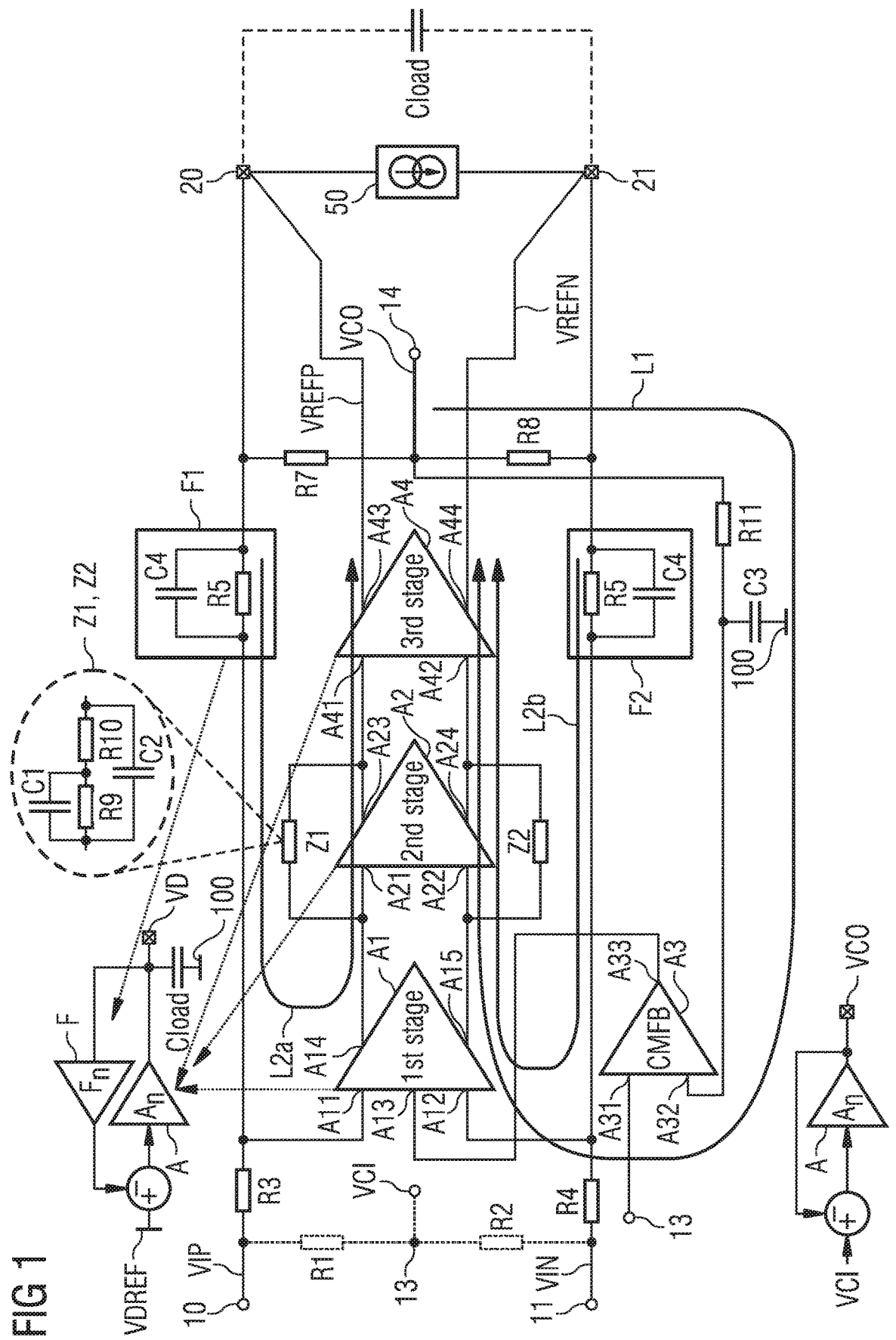
FIG. 1 shows an exemplary embodiment of a differential amplifier arrangement and of a converter arrangement as proposed.

FIG. 1 shows an exemplary embodiment of a differential amplifier arrangement and of a converter arrangement as proposed. The amplifier arrangement has a first input 10, a second input 11, a first output 20, a second output 21, a common mode loop L1 and a differential mode loop L2a, L2b. The first input 10 is configured to receive a first input signal VIP. The second input 11 is configured to receive a second input signal VIN. The first output 20 is configured to provide a first output signal VREFP. The second output 21 is configured to provide a second output signal VREFN. The common mode loop L1 is configured to regulate a common mode output of the differential amplifier arrangement depending on a difference between a common mode reference signal VCI and an average of the first and the second output signal VREFP, VREFN. The differential mode loop L2a, L2b is configured to regulate a differential mode output of the differential amplifier arrangement depending on a difference between a difference between the first and the second input signal VIP, VIN and a difference between the first and the second output signal VREFP, VREFN. Therein the difference between the first and the second output signal VREFP, VREFN is substantially constant.

The differential amplifier arrangement generates a differential output signal in the form of the first output signal VREFP and the second output signal VREFN depending on a differential input signal represented by the first input signal VIP and the second input signal VIN.

First and second input signals VIP, VIN, as well as first and second output signals VREFP, VREFN may each comprise a voltage signal or a voltage. In an exemplary implementation, a voltage value of the first input signal VIP may be at 0 V, a voltage value of the second input signal VIN may be at 1.8 V, a voltage value of the first output signal VREFP may be 1350 mV, a voltage value of the second output signal VREFN may be 450 mV.

In the depicted exemplary embodiment, the differential amplifier arrangement is made up of three amplifying stages. A first amplifying stage comprises a first differential amplifier A1, a second amplifying stage comprises a second differential amplifier A2 and a third amplifying stage comprises a fourth differential amplifier A4. It is to be noted that the third amplifying stage, i.e. the fourth differential amplifier A4, is optional.

The first differential amplifier A1 has a first and a second input A11, A12 forming a first pair of differential input terminals. Furthermore, the first differential amplifier A1 has a first and a second output terminal A14, A15, forming a first pair of differential output terminals. The first amplifier A1 further has a control terminal A13 which is configured to control an internal current source of the first amplifier A1. The first input terminal A11 of the first amplifier A1 is connected to the first input 10, for instance via a resistor R3. The second input terminal A12 of the first amplifier A1 is connected to the second input 11, for example via a resistor R4.

The second differential amplifier A2 has a first input terminal A21, a second input terminal A22, which together represent a second pair of differential input terminals. The second differential amplifier A2 also has a first output terminal A23 and a second output terminal A24, which together represent a second pair of differential output terminals. The first input terminal A21 of the second amplifier A2 is connected, for example in a direct manner, to the first output terminal A14 of the first amplifier. The second input terminal A22 of the second amplifier A2 is connected, for instance in a direct manner, to the second output terminal A15 of the first amplifier A1.

The fourth differential amplifier A4 has a first input terminal A41 and a second input terminal A42, which represent a third pair of differential input terminals. The fourth amplifier A4 also has a first output terminal A43 and a second output terminal A44 which together represent a third pair of differential output terminals. In the depicted example, the first output A43 of the fourth amplifier A4 is connected, for instance directly, to the first output 20. The second output terminal A44 of the fourth amplifier A4 is connected, for instance directly, to the second output 21. In a realization without the optional fourth amplifier A4, the first output A23 of the second amplifier is connected to the first output 20, while the second output terminal A24 of the second amplifier A2 is connected to the second output 21.

The differential amplifier arrangement also comprises a first transimpedance element Z1 and a second transimpedance element Z2. The first transimpedance element Z1 is connected in a feedback loop between the first input terminal A21 of the second differential amplifier A2 and the first output terminal A23 of the second differential amplifier A2. The second transimpedance element Z2 is connected in another feedback loop between the second output terminal A24 and the second input terminal A22 of the second differential amplifier A2. Each of first and second transimpedance elements Z1, Z2 essentially comprises a first resistor R9, a second resistor R10, a first capacitor C1 and a second capacitor C2. The first resistor R9 and the first capacitor C1 are connected in parallel, forming a parallel connection. The second resistor R10 is connected in series to the parallel connection, thereby forming a serial connection. The second capacitor C2 is connected in parallel to said serial connection. Therein, the first and the second resistor R9, R10 are dimensioned substantially equal, while the first capacitor C1 is dimensioned to have a much higher capacitance value than the capacitance of the second capacitor C2.

In the depicted exemplary embodiment the differential amplifier arrangement further has a first voltage divider R1, R2 and a second voltage divider R7, R8. The first voltage divider has a serial connection of resistors R1 and R2. Said serial connection is connected between the first input 10 and the second input 11 of the amplifier arrangement. Resistors R1 and R2 are dimensioned substantially equal. A connection point between resistors R1 and R2 forms a node 13 at which a common mode reference signal VCI is provided. In this exemplary embodiment, the common mode reference signal VCI is implemented by an average input signal VCI which amounts to half of the sum of the first and the second input signals VIP, VIN. In detail, the average input signal VCI amounts to:

$$VCI=(VIP+VIN)/2$$

Therein, VCI represents the average input signal VCI, VIP represents the first input signal VIP, VIN represents the second input signal VIN.

The first voltage divider R1, R2 represents one implementation possibility for generating the common mode reference signal VCI.

The second voltage divider R7, R8 is connected between the first output 20 and the second output 21. It comprises a serial connection of resistor R7 and resistor R8. Resistors R7 and R8 are dimensioned substantially equal. A connection point between resistor R7 and resistor R8 forms a node 14, at which an average output signal VCO is provided. The average output signal VCO amounts to half of the sum of the first output signal VREFP and the second output signal VREFN. In detail, the average output signal VCO amounts to:

$$VCO=(VREFP+VREFN)/2$$

Therein, VCO represents the average output signal VCO, VREFP represents the first output signal VREFP, VREFN represents the second output signal VREFN.

The differential amplifier arrangement in the depicted embodiment further comprises a first feedback filter F1 and a second feedback filter F2. The first feedback filter F1 is connected between the first output 20 and the first input 10. The second feedback filter F2 is connected to the second output 21 and to the second input 11. Each of first and second feedback filters F1, F2, comprises a parallel connection of a capacitor C4 and a resistor R5.

The differential amplifier arrangement further comprises a common mode feedback amplifier A3 and a filter component R11, C3. The common mode feedback amplifier A3 has a first feedback input terminal A31, a second feedback input terminal A32 and a feedback output terminal A33. The first feedback input terminal A33 is connected, for instance directly, to the node 13 and consequently receives the average input signal VCI. The second feedback input terminal A32 is connected by means of the filter component C3, R11 to the node 14. It consequently receives the average output signal VCO which is filtered by the filter component C3, R11. The feedback output terminal A33 is connected, for instance directly, to the control terminal A13 of the first differential amplifier A1. The filter component comprises a filter capacitor C3 and a filter resistor R11. The filter capacitor C3 is connected, for example directly, to the second feedback input terminal A32 and to a reference potential terminal 100. The filter resistor R11 is connected with one terminal to the second feedback input terminal A32 and with its other terminal the filter resistor R11 is connected, for instance directly, to the node 14.

The common mode loop L1 comprises the first and the second amplifying stage, and also optionally the third amplifying stage, as well as the common mode feedback amplifier A3 and the filter component R11, C3. An equivalent circuit of the common mode loop L1 is depicted on the left side below the circuit diagram of the amplifier arrangement. An amplifier A represents the three amplifying stages described above. The average output signal VCO is subtracted from the average input signal VCI and the resulting difference is coupled back into the common mode loop.

The common mode feedback amplifier A3 regulates at least part of the current source of the first amplifier A1 depending on the difference between the average of the first and the second input signals, i.e. average input signal VCI, and the average of the first and the second output signals, i.e. average output signal VCO. The filter component R11, C3 adds a low frequency pole, which improves the stability of the common mode feedback loop L1. The depicted three-stage amplifier does not have to be internally Miller-compensated, as in state of the art implementations, because the low frequency pole realized by the filter component R11 and C3 fulfills this task instead.

The differential mode loop comprises a first branch L2a and a second branch L2b. The first branch L2a of the differential mode loop is formed by the first, second, and optionally the third amplifying stages, the first feedback filter F1 and the first transimpedance element Z1. The second branch L2b of the differential mode loop is formed by the first, second, and optionally the third amplifying stages, the second feedback filter F2 and the second transimpedance element Z2. An equivalent circuit of the differential mode loop is depicted above the differential amplifier on the left side. The difference between the first output signal VREFP and the second output signal VREFN, denoted signal VD, is coupled back via a feedback factor F, which is realized by the first feedback filter F1 together with resistor R3 and the second feedback filter F2 together with resistor R4, to an input side of the amplifier A. At the input side a difference of the first input signal VIP and the second input signal VIN, denoted signal VDREF, is present. From this difference signal VDREF the difference signal VD—filtered by the filter F—is subtracted and the resulting signal is fed to the input of the amplifier A. A load capacitor Cload is connected to the differential output in the equivalent circuit.

The common mode loop is compensated by means of a first pole created by resistor R11 and capacitor C3. By means of the high gain slow common mode loop L1 and the low gain fast differential mode loop L2a, b, a low frequency zero and further, a second pole by means of the first resistor R9 and the first capacitor C1, give rise to a lead lag compensation. Furthermore, a second lead lag compensation is created by a zero by the combination of the first and the second resistor R9, R10 and the first capacitor C1, and a pole by the combination of the first and the second resistor R9, R10 and the second capacitor C2. The differential loop is mainly compensated by the connectable load capacitor Cload. In order not to trade DC gain off with the stability, the first and the second transimpedance elements Z1, Z2 are introduced to create a lag lead compensation for further stabilization of the amplifier.

In an alternative realization of the filter component R11, C3 in the common mode loop L1 the filter resistor R11 may be replaced by a transconductance which receives the average output signal VCO as known to those skilled in the art.

In an alternative realization other loop shaping and other pole/zero shaping may be applied such that the overall common mode loop gain has a 20 dB/dec crossover.

In an alternative, the amplifier arrangement's differential mode response is made wideband and consequently is only limited by the external load capacitor.

A converter arrangement comprises the differential amplifier arrangement as described above, the load capacitor Cload, as well as an analog-to-digital converter 50. The load capacitor Cload is connected between the first output 20 and the second output 21 of the differential amplifier arrangement. The analog-to-digital converter, ADC, 50 is also connected between the first output 20 and the second output 21 of the differential amplifier arrangement. The load capacitor Cload may thereby have a capacitance in the range of microfarad, for example four microfarad. The proposed differential amplifier arrangement is able to drive the ADC 50 and the load capacitor Cload of the converter arrangement. It thereby achieves good linearity, good settling time and good noise performance in comparison to state of the art solutions.

Figure 2:
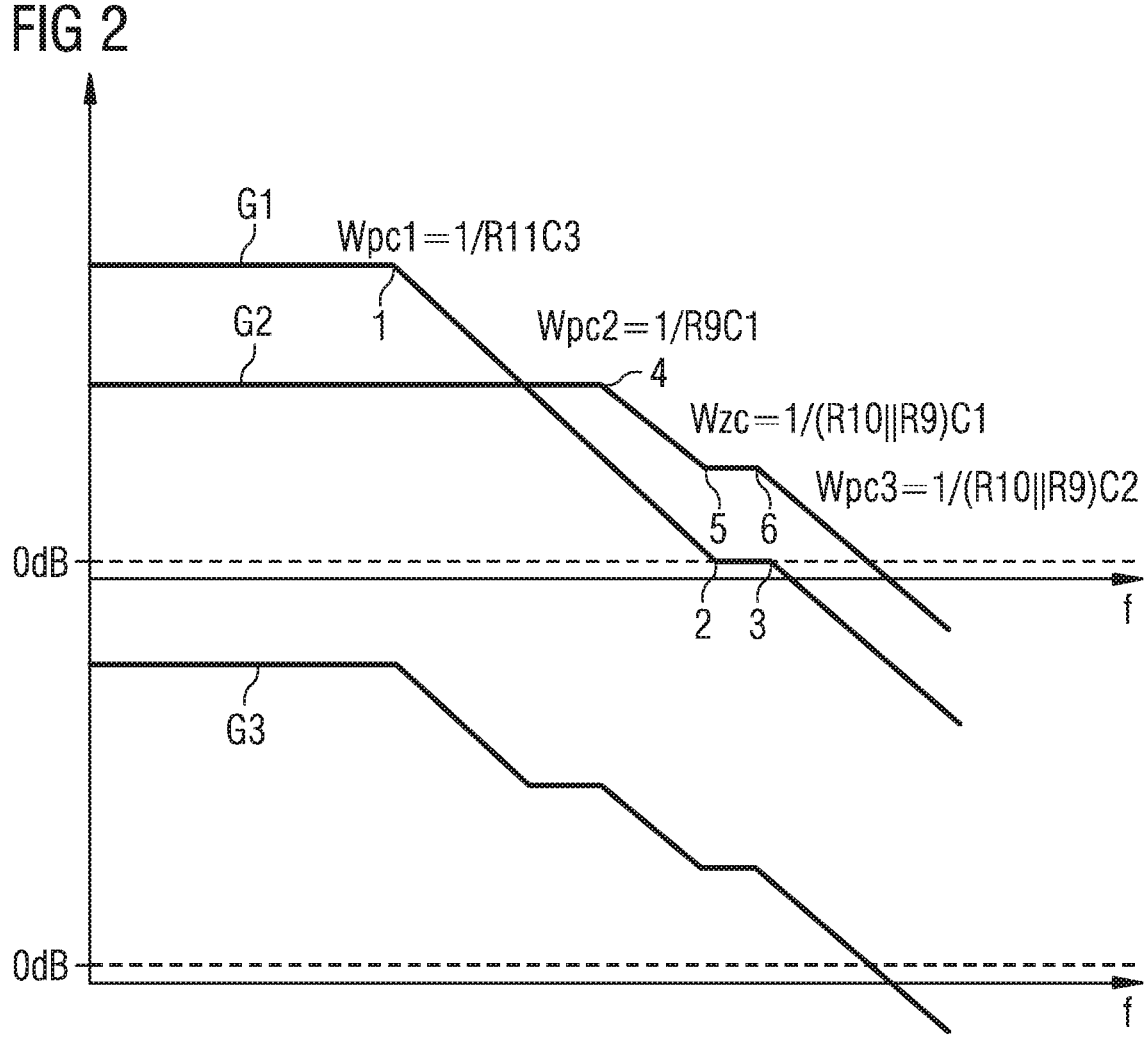
FIG. 2 shows exemplary diagrams for the embodiment of FIG. 1.

FIG. 2 shows exemplary diagrams for the embodiment of FIG. 1. In the upper part of FIG. 2, graph G1 shows a loop gain of the common mode loop L1 and graph G2 shows a common mode of loops L2a, b in relation to frequency f in a separate form. In the lower part of FIG. 2 graph G3 shows the resulting overall common mode loop gain in relation to frequency f.

It can be discerned that the graph G1 has a first pole 1 resulting from the filter component R11, C3 as indicated in FIG. 2. It furthermore has a zero 2 resulting from the first resistor R9, the second resistor R10 and the first capacitor C1 of the first and the second transimpedance element Z1, Z2. Also, it has a second pole 3 resulting from the first resistor R9, the second resistor R10 and the second capacitor C2 of the first and the second transimpedance elements Z1, Z2.

The graph G2 shows the common mode of loops L2a, b. It has a first pole 4 resulting from the first resistor R9 and the first capacitor C1 of the first and the second transimpedance elements Z1, Z2. It furthermore has a zero 5 resulting from the first resistor R9, the second resistor R10 and the first capacitor C1 of the first and the second transimpedance elements Z1, Z2. Also, it has a second pole 6 resulting from the first resistor R9, the second resistor R10 and the second capacitor C2 of the first and the second transimpedance elements Z1, Z2.

With all of the above the common mode loop is stabilized completely by internal poles and zeros, thus not requiring need for external compensation.

Figure 3:
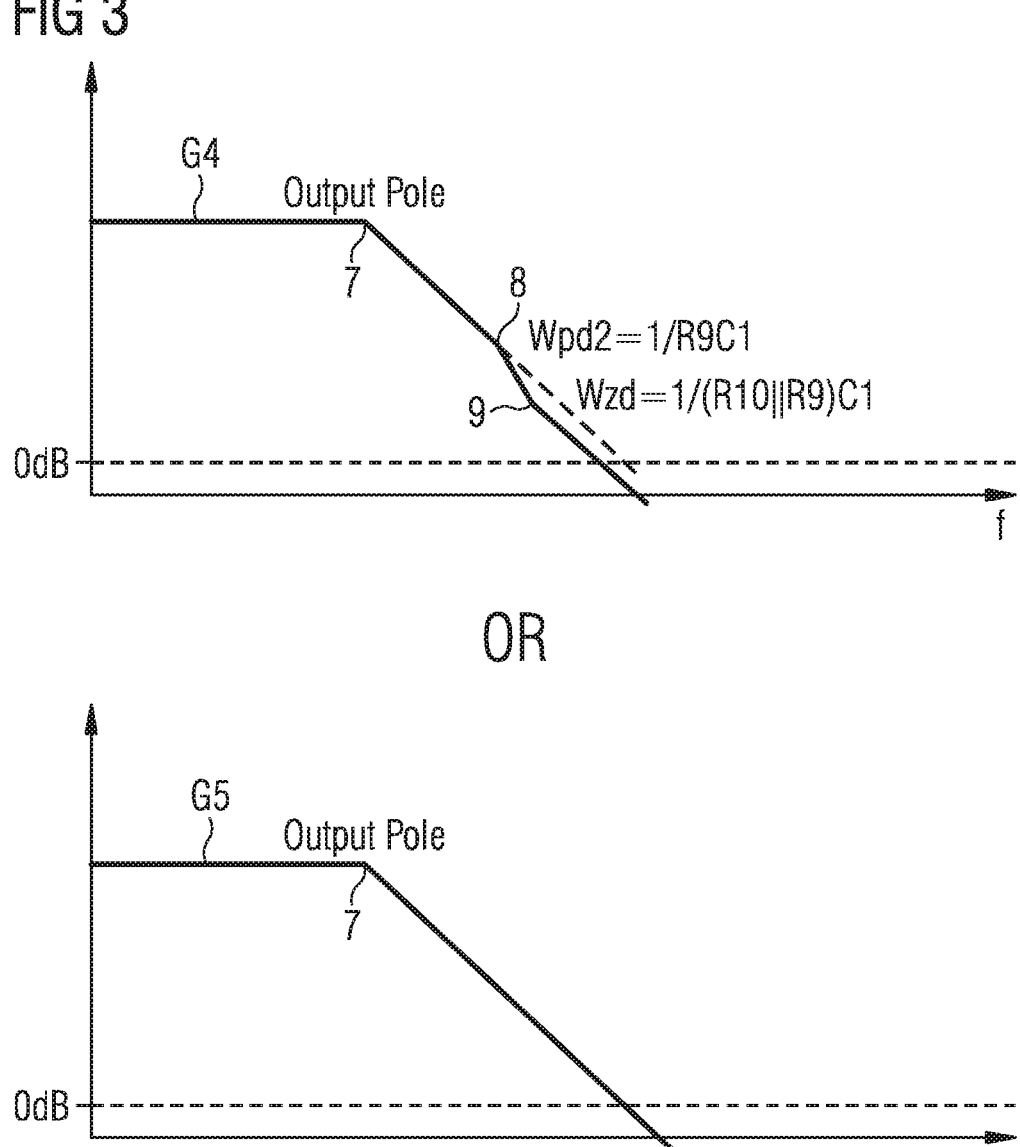
FIG. 3 shows exemplary diagrams for the embodiment of FIG. 1.

FIG. 3 shows exemplary diagrams for the embodiment of FIG. 1. The differential mode loop gain of loops L2a, b is respectively depicted in relation to frequency f. In the upper part a first alternative is shown in the form of graph G4. Graph G4 has a first fall 7 resulting from the output pole formed by the load capacitor Cload and an equivalent resistance of the amplifier arrangement of FIG. 1. A pole 8 results from the first resistor R1 and the first capacitor C9. A zero 9 results from the second resistor R10, the first resistor R9 and the first capacitor C1 as indicated in FIG. 3. By means of the above, the stability of the amplifier arrangement becomes independent of the load regulation.

In the lower part of FIG. 3 graph G5 is depicted, showing an alternative differential mode loop gain of loops L2a, b in relation to frequency f. The first fall 7 results from the output pole formed by the load capacitor Cload and the equivalent resistance of the circuit arrangement of FIG. 1.

It will be appreciated that the disclosure is not limited to the disclosed embodiments and to what has been particularly shown and described hereinabove. Rather, features recited in separate dependent claims or in the description may advantageously be combined. Furthermore, the scope of the disclosure includes those variations and modifications, which will be apparent to those skilled in the art. The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope.

The invention claimed is:

1. A differential amplifier arrangement comprising:
a first input configured to receive a first input signal,
a second input configured to receive a second input signal,
a first output configured to provide a first output signal,
a second output configured to provide a second output signal,
a common mode loop configured to regulate a common mode output of the differential amplifier arrangement depending on a difference between a common mode reference signal and an average of the first and the second output signal, and
a differential mode loop configured to regulate a differential mode output of the differential amplifier arrangement depending on a difference between a difference between the first and the second input signal and a difference between the first and the second output signal,
wherein the difference between the first and the second output signal is substantially constant,
wherein the common mode loop is further configured to implement at least one low frequency pole by means of which the common mode loop is slowed down, wherein the differential amplifier arrangement comprises at least a first and a second amplifying stage,
wherein the first amplifying stage comprises a first differential amplifier having a first pair of differential input terminals, a first pair of differential output terminals and a control terminal, the first pair of differential input terminals being connected to the first and the second input,
wherein the second amplifying stage comprises a second differential amplifier having a second pair of differential input terminals and a second pair of differential output terminals, the second pair of differential input terminals being connected to the first pair of differential output terminals of the first differential amplifier, the second pair of differential output terminals being connected to the first and the second output;
wherein the differential mode loop comprises at least the first and the second amplifying stage, a first and a second transimpedance element,
wherein the first transimpedance element is connected in a feedback loop between a first terminal of the second pair of differential input terminals and a first terminal of the second pair of differential output terminals of the second differential amplifier thereby forming a first branch of the differential mode loop,
wherein the second transimpedance element is connected in an additional feedback loop between a second terminal of the second pair of differential input terminals and a second terminal of the second pair of differential output terminals of the second differential amplifier, thereby forming a second branch of the differential mode loop;
wherein each of the first and the second transimpedance elements comprises a first and a second resistor and a first and a second capacitor, and
wherein the first resistor and the first capacitor are connected in parallel forming a parallel connection, the second resistor is connected in series to the parallel connection, thereby forming a serial connection, and the second capacitor is connected in parallel to the serial connection.

2. The differential amplifier arrangement of claim 1, wherein a unity gain frequency of the common mode loop is higher than a unity gain frequency of the differential mode loop.

3. The differential amplifier arrangement according to claim 1,
wherein an overall common mode loop of the differential amplifier arrangement is configured to implement at least two sets of poles and zeros by means of which a gain of said overall common mode loop has a 20 decibel per decade zero crossing.

4. The differential amplifier arrangement according to claim 1,
wherein the common mode loop comprises at least the first and the second amplifying stage, a common mode feedback amplifier and a filter component,
wherein the common mode feedback amplifier has a first and a second feedback input terminal and a feedback output terminal, wherein the first feedback input terminal is configured to receive the common mode reference signal and the feedback output terminal is connected to the control terminal of the first differential amplifier,
wherein the filter component comprises a filter capacitor and a filter resistor, wherein the filter capacitor is connected to the second feedback input terminal and to a reference potential terminal and wherein the filter resistor is connected with one terminal to the second feedback input terminal, another terminal of the filter resistor being configured to receive the average of the first and the second output signal.

5. The differential amplifier arrangement according to claim 1, wherein a capacitance of the first capacitor is dimensioned to be larger than a capacitance of the second capacitor.

6. The differential amplifier arrangement according to claim 1, wherein the common mode reference signal is represented by an average of the first and the second input signal.

7. The differential amplifier arrangement according to claim 1, wherein the first output of the differential amplifier arrangement is configured to be connected to a first terminal of a connectable load capacitor and the second output of the differential amplifier arrangement is configured to be connected to a second terminal of the connectable load capacitor, and wherein the connectable load capacitor has a capacitance in a micro Farad range.

8. A converter arrangement comprising the differential amplifier arrangement according to claim 7, the connectable load capacitor which is connected between the first and the second output of the differential amplifier arrangement and an analog-to-digital converter which is connected between the first and the second output of the differential amplifier arrangement.

\* \* \* \* \*